United States Patent
Lu et al.

(10) Patent No.: US 10,304,793 B2
(45) Date of Patent: May 28, 2019

(54) PACKAGE STRUCTURE AND METHOD FOR FORMING THE SAME

(71) Applicant: Taiwan Semiconductor Manufacturing Co., Ltd., Hsinchu (TW)

(72) Inventors: Tsung-Hsing Lu, Jhubei (TW); Pei-Haw Tsao, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/363,621

(22) Filed: Nov. 29, 2016

(65) Prior Publication Data

US 2018/0151498 A1 May 31, 2018

(51) Int. Cl.
 *H01L 23/00* (2006.01)
 *H01L 23/31* (2006.01)
 *H01L 23/538* (2006.01)
 *H01L 21/56* (2006.01)

(52) U.S. Cl.
 CPC ............ *H01L 24/19* (2013.01); *H01L 21/568* (2013.01); *H01L 23/3171* (2013.01); *H01L 23/5389* (2013.01); *H01L 24/20* (2013.01); *H01L 23/3128* (2013.01); *H01L 2224/04105* (2013.01); *H01L 2224/12105* (2013.01); *H01L 2224/24137* (2013.01); *H01L 2224/96* (2013.01); *H01L 2924/14* (2013.01); *H01L 2924/3512* (2013.01)

(58) Field of Classification Search
 CPC ............. H01L 23/5386; H01L 23/3135; H01L 23/3171; H01L 24/05; H01L 24/19; H01L 24/20; H01L 2924/14
 USPC ........................................................ 257/421
 See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,564,577 B1 * | 2/2017 | Hsu .................. H01L 43/02 |
| 9,589,932 B2 * | 3/2017 | Yu .................. H01L 23/3135 |

(Continued)

*Primary Examiner* — Matthew E Warren
(74) *Attorney, Agent, or Firm* — Birch, Stewart, Kolasch & Birch, LLP

(57) ABSTRACT

Package structures and methods for forming the package structures are provided. A package structure includes a molding compound having a surface. The package structure also includes an integrated circuit die in the molding compound. The integrated circuit die has a portion protruding from the surface. The package structure further includes a planarization layer covering the surface. The planarization layer surrounds the portion of the integrated circuit die. In addition, the package structure includes a redistribution layer electrically connected to the integrated circuit die. The redistribution layer covers the planarization layer and the integrated circuit die.

20 Claims, 9 Drawing Sheets

(56) References Cited

U.S. PATENT DOCUMENTS

| | | |
|---|---|---|
| 2011/0221041 A1* | 9/2011 | Lin .................. H01L 21/561 |
| | | 257/620 |
| 2011/0291288 A1 | 12/2011 | Wu et al. |
| 2013/0062760 A1 | 3/2013 | Hung et al. |
| 2013/0062761 A1 | 3/2013 | Lin et al. |
| 2013/0119494 A1* | 5/2013 | Li ..................... H01L 43/08 |
| | | 257/421 |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0365505 A1* | 12/2016 | Lu .................... H01L 27/222 |
| 2017/0033063 A1* | 2/2017 | Lin ................... H01L 21/565 |
| 2017/0317030 A1* | 11/2017 | Yu .................. H01L 21/76877 |

* cited by examiner

PACKAGE STRUCTURE AND METHOD FOR FORMING THE SAME

BACKGROUND

With the constant evolution of semiconductor technology, semiconductor dies are becoming increasingly smaller. More functions, however, need to be integrated into these semiconductor dies. Accordingly, these semiconductor dies have increasingly greater numbers of I/O pads, and the density of the I/O pads is quickly rising. As a result, the packaging of semiconductor dies is becoming more challenging.

Package technologies can be divided into multiple categories. In one of the categories, dies are sawed first, and then the "known-good-dies" are placed on a temporary wafer or panel-like carrier. Redistribution layers (RDLs) are made onto the "re-configured" wafer or panel after encapsulation or molding of the dies. Afterwards, conductive balls are attached, and then the "re-configured" wafer or panel is sawed to get a singulated package. The RDLs can "fan-out" the I/O pads to the area outside of the die area so as to accommodate high I/O devices for a given ball pitch requirement.

New packaging technologies have been developed to further improve the density and functions of semiconductor dies. These relatively new types of packaging technologies for semiconductor dies face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
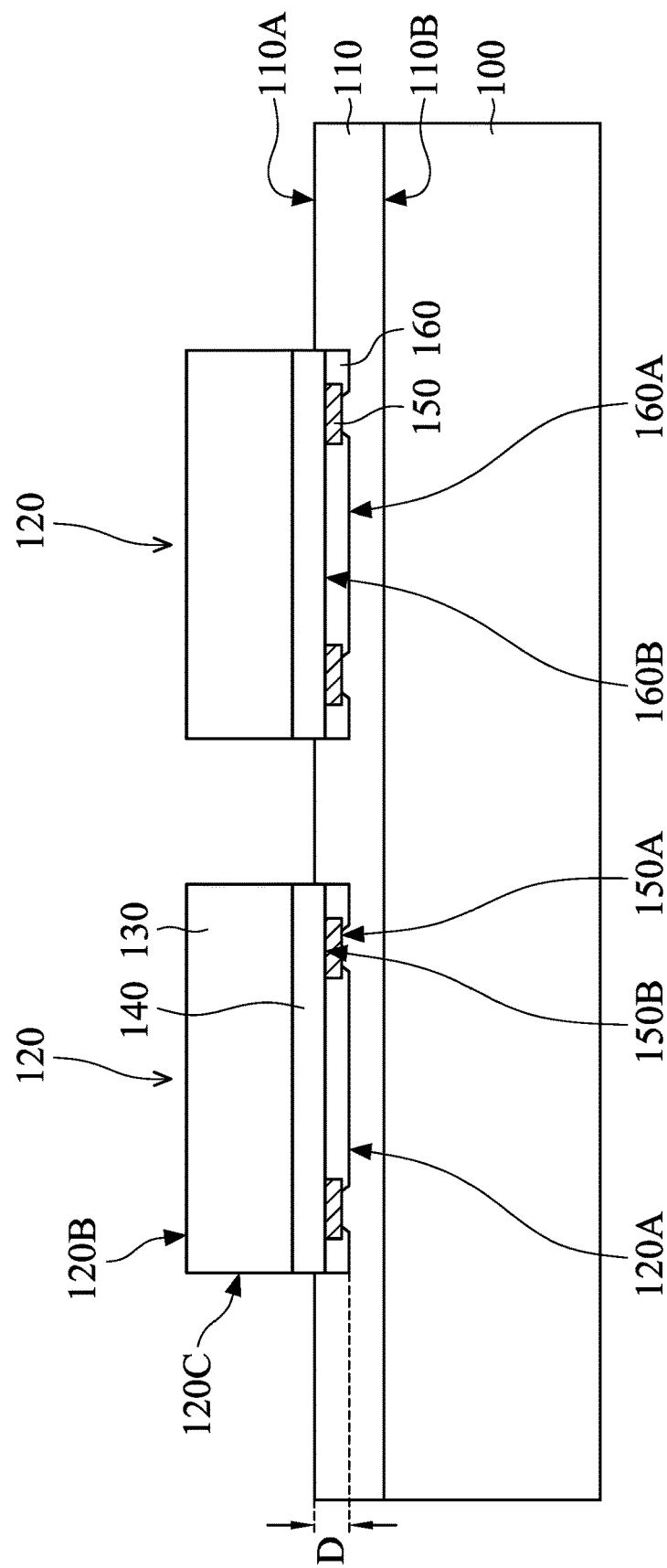
FIGS. 1A-1G are cross-sectional views of various stages of a process for forming a package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1G are cross-sectional views of various stages of a process for forming a package structure, in accordance with some embodiments. Additional operations can be provided before, during, and/or after the stages described in FIGS. 1A-1G. Some of the stages that are described can be replaced or eliminated for different embodiments. Additional features can be added to the package structure. Some of the features described below can be replaced or eliminated for different embodiments. Although some embodiments are discussed with operations performed in a particular order, these operations may be performed in another logical order.

As shown in FIG. 1A, a carrier substrate 100 is provided, in accordance with some embodiments. In some embodiments, the carrier substrate 100 is used as a temporary substrate. The carrier substrate 100 provides mechanical and structural support during subsequent processing steps. Afterwards, the carrier substrate 100 may be removed.

In some embodiments, the carrier substrate 100 includes a glass substrate, a ceramic substrate, a polymer substrate, another suitable supporting material, or a combination thereof. In some embodiments, the carrier substrate 100 is a glass wafer or another suitable wafer.

Afterwards, an adhesive layer 110 is deposited over the carrier substrate 100, in accordance with some embodiments. The adhesive layer 110 may be referred to as a temporary adhesive layer or a release layer.

The adhesive layer 110 may be made of glue, or may be a lamination material, such as a tape. In some embodiments, the adhesive layer 110 is photosensitive and is easily detached from the carrier substrate 100 by light irradiation. For example, shining ultra-violet (UV) light or laser light on the carrier substrate 100 can detach the adhesive layer 110. In some embodiments, the adhesive layer 110 is a light-to-heat-conversion (LTHC) coating. In some other embodiments, the adhesive layer 110 is heat-sensitive and is easily detached from the carrier substrate 100 when it is exposed to heat.

As shown in FIG. 1A, one or more integrated circuit dies 120 are placed over the adhesive layer 110, in accordance with some embodiments. In some embodiments, the integrated circuit dies 120 are sawed from one or more integrated circuit wafers. The integrated circuit dies 120 may be "known-good-dies". In some embodiments, the integrated circuit dies 120 are device dies including transistors, diodes, or another suitable integrated circuit element. The device dies may also include capacitors, inductors, resistors, another integrated circuit element, or a combination thereof. In some embodiments, the integrated circuit dies 120 are sensor dies, logic dies, central processing unit (CPU) dies, memory dies, or other suitable dies.

In some embodiments, the integrated circuit dies 120 have an active surface 120A and a non-active surface 120B that is opposite to the active surface 120A. In some embodiments, the active surface 120A faces the adhesive layer 110. In some embodiments, each of the integrated circuit dies 120 includes a semiconductor substrate 130, a dielectric layer 140, conductive pads 150 and a passivation layer 160.

The semiconductor substrate 130 is adjacent to the non-active surface 120B of the integrated circuit dies 120. In some embodiments, the semiconductor substrate 130 includes silicon or another elementary semiconductor material such as germanium. In some other embodiments, the semiconductor substrate 130 includes a compound semiconductor. The compound semiconductor may include gallium arsenide, silicon carbide, indium arsenide, indium phosphide, another suitable compound semiconductor, or a combination thereof.

In some embodiments, the semiconductor substrate 130 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

Various device elements (not shown) are formed in and/or over the semiconductor substrate 130, in accordance with some embodiments. Examples of the various device elements include transistors, diodes, another suitable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.

In some embodiments, the dielectric layer 140 is over the semiconductor substrate 130. The dielectric layer 140 may cover the device elements over the semiconductor substrate 130. The dielectric layer 140 may include an interlayer dielectric (ILD) layer and inter-metal dielectric (IMD) layers. Multiple conductive features (not shown) are in the ILD layer and IMD layers and electrically connected to the device elements in and/or over the semiconductor substrate 130. The conductive features may include conductive contacts, conductive lines and/or conductive vias.

In some embodiments, the dielectric layer 140 is made of silicon oxide, silicon oxynitride, borosilicate glass (BSG), phosphoric silicate glass (PSG), borophosphosilicate glass (BPSG), fluorinated silicate glass (FSG), low-K material, porous dielectric material, another suitable dielectric material, or a combination thereof. The material of the dielectric layer 140 is selected to minimize size, propagation delays, and crosstalk between nearby conductive features.

In some embodiments, the conductive pads 150 are positioned over the dielectric layer 140. The conductive pads 150 are electrically connected to the device elements in and/or over the semiconductor substrate 130 through the conductive features in the dielectric layer 140. In some embodiments, there is no conductive feature, such as a conductive bump or pillar, on the conductive pads 150.

In some embodiments, the passivation layer 160 is positioned over the dielectric layer 140 and adjacent to the active surface 120A of the integrated circuit dies 120. The passivation layer 160 partially covers the conductive pads 150. As a result, each of the conductive pads 150 is partially exposed from the passivation layer 160.

As shown in FIG. 1A, each of the conductive pads 150 has opposite surfaces 150A and 150B, and the passivation layer 160 has opposite surfaces 160A and 160B. The surface 150B of the conductive pads 150 may be substantially coplanar with the surface 160B of the passivation layer 160. The surface 150A of the conductive pads 150 may be non-coplanar with the surface 160A of the passivation layer 160. The surface 150A may be between the surface 160A and the surface 150B.

In some embodiments, the integrated circuit dies 120 are reversed and placed over the adhesive layer 110. As a result, the surface 150A of the conductive pads 150 and the surface 160A of the passivation layer 160 face the adhesive layer 110. In some embodiments, the surface 150A of the conductive pads 150 is in direct contact with the adhesive layer 110. In some embodiments, the surface 160A of the passivation layer 160 is in direct contact with the adhesive layer 110.

The passivation layer 160 may include multiple sub-layers. In some embodiments, the total thickness of the passivation layer 160 and the dielectric layer 140 is in a range from about 1 μm to about 30 μm. However, embodiments of the disclosure are not limited thereto.

In some embodiments, the passivation layer 160 is made of a polymer material. In some embodiments, the passivation layer 160 includes polyimide, polybenzoxazole (PBO), benzocyclobutene (BCB), silicone, acrylates, siloxane, another suitable material, or a combination thereof. In some other embodiments, the passivation layer 160 includes non-organic materials. The non-organic materials may include silicon oxide, un-doped silicate glass, silicon oxynitride, solder resist (SR), silicon nitride, silicon carbide, hexamethyldisilazane (HMDS), another suitable material, or a combination thereof.

As shown in FIG. 1A, the integrated circuit dies 120 slightly or partially sink into the adhesive layer 110, in accordance with some embodiments. As a result, the adhesive layer 110 partially surrounds the integrated circuit dies 120. In some embodiments, the integrated circuit dies 120 are not deeply sink into the adhesive layer 110 and are not completely immersed in the adhesive layer 110.

In some embodiments, the active surface 120A of the integrated circuit dies 120 is embedded in the adhesive layer 110, and is non-coplanar with the top surface 110A of the adhesive layer 110. In some embodiments, the integrated circuit dies 120 are spaced apart from the bottom surface 110B of the adhesive layer 110. As a result, the active surface 120A is non-coplanar with the bottom surface 110B of the adhesive layer 110. The active surface 120A is positioned between the top surface 110A and the bottom surface 110B of the adhesive layer 110.

In some embodiments, the sidewall 120C of the integrated circuit dies 120 is partially covered by the adhesive layer 110. Although FIG. 1A shows that the top surface 110A of the adhesive layer 110 is substantially perpendicular to the sidewall 120C of the integrated circuit dies 120, embodiments of the disclosure are not limited thereto. In some other embodiments, the top surface 110A of the adhesive layer 110 is inclined to the sidewall 120C of the integrated circuit dies 120. The top surface 110A of the adhesive layer 110 may be curved.

In some embodiments, one or more portions of the adhesive layer 110 are pressed and squeezed by the integrated circuit dies 120. As a result, one or more portions of the adhesive layer 110 are recessed from the top surface 110A towards the bottom surface 110B along the sidewall 120C. Recesses may be formed between the recessed top surface 110A of the adhesive layer 110 and the sidewall 120C of the integrated circuit dies 120. The recesses may gradually shrink along the sidewall 120C. Alternatively, one or more portions of the adhesive layer 110 may protrude from the top surface 110A along the sidewall 120C. The protrusions may gradually shrink along the sidewall 120C.

As shown in FIG. 1A, the integrated circuit dies 120 sink into the adhesive layer 110 by a depth D. In some embodiments, the depth D is in a range from about 1 µm to about 20 µm. However, embodiments of the disclosure are not limited thereto. The depth D may vary according to the material of the adhesive layer 110 and/or the placement of the integrated circuit dies 120.

In some embodiments, the passivation layer 160 and the conductive pads 150 of the integrated circuit dies 120 are partially or completely dipped into the adhesive layer 110. In some embodiments, the dielectric layer 140 is partially or completely immersed in the adhesive layer 110. The adhesive layer 110 may enclose the passivation layer 160, the conductive pads 150, the dielectric layer 140 and/or the semiconductor substrate 130. The top surface 110A of the adhesive layer 110 may or may not be coplanar with the surface 160B of the passivation layer 160.

Figure 1B:
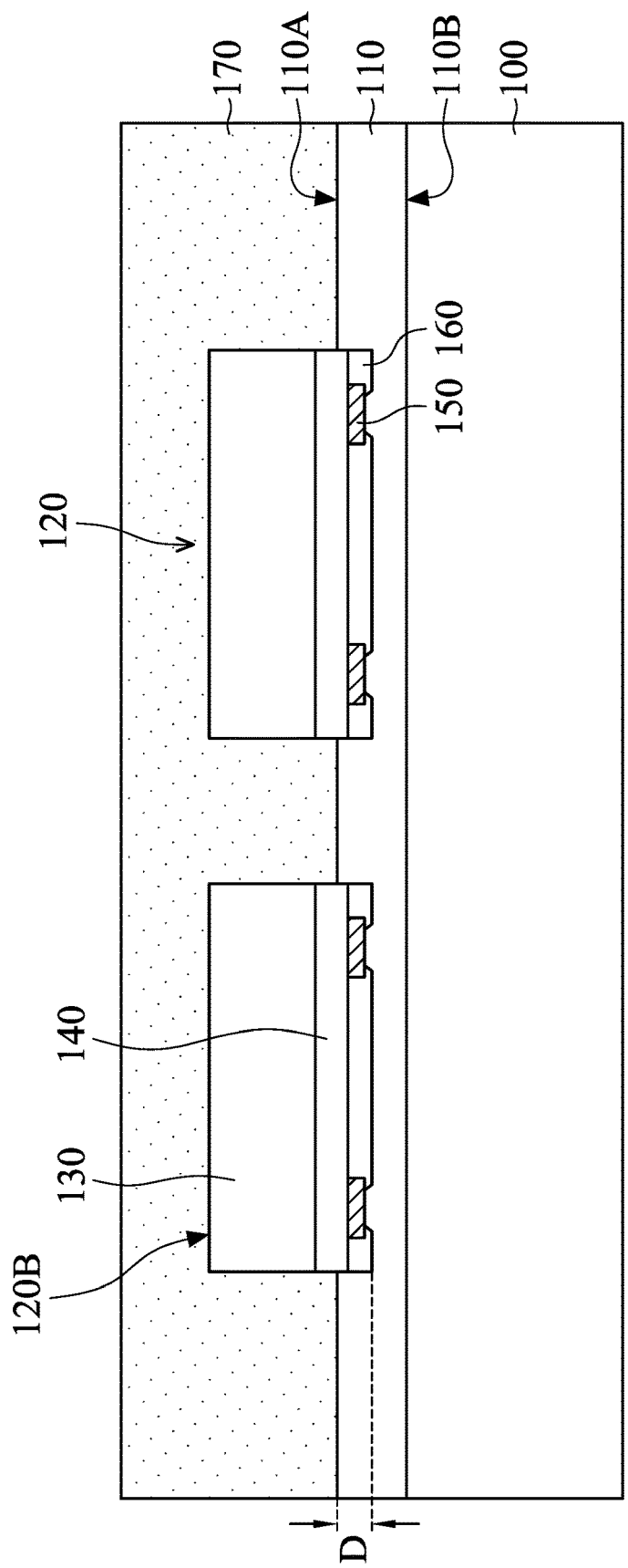

As shown in FIG. 1B, a package layer 170 is deposited over the top surface 110A of the adhesive layer 110, in accordance with some embodiments. The package layer 170 covers the top surface 110A of the adhesive layer 110 and the non-active surface 120B of the integrated circuit dies 120. The package layer 170 continuously encircles the integrated circuit dies 120. In some embodiments, the package layer 170 is in direct contact with the adhesive layer 110.

As shown in FIG. 1B, the package layer 170 partially wraps the integrated circuit dies 120, in accordance with some embodiments. In other words, the package layer 170 and the adhesive layer 110 together completely wrap the integrated circuit dies 120. In some embodiments, the dielectric layer 140 and/or the semiconductor substrate 130 are partially or completely surrounded by the package layer 170. The package layer 170 is separated from the passivation layer 160 so that the conductive pads 150 in the passivation layer 160 are not surrounded by the package layer 170.

Many variations and/or modifications can be made to embodiments of the disclosure. In some other embodiments, the passivation layer 160 is partially surrounded by the package layer 170, and the conductive pads 150 are partially or completely surrounded by the package layer 170.

As mentioned above, the adhesive layer 110 has recesses and/or protrusions along the sidewall 120C of the integrated circuit dies 120, in accordance with some embodiments. The package layer 170 may fill up the recesses. The package layer 170 may cover and surround the protrusions.

In some embodiments, the package layer 170 includes a polymer material. In some embodiments, the package layer 170 includes a molding compound. In some embodiments, the package layer 170 includes fillers dispersed therein. The fillers may include insulating fibers, insulating particles, other suitable elements, or a combination thereof. In some embodiments, the package layer 170 is formed by a compression molding process, an immersion molding process, another applicable process, or a combination thereof.

In some embodiments, the integrated circuit dies 120 are dipped further into the adhesive layer 110 during the formation of the package layer 170 or another subsequent process. As a result, the depth D is increased. The depth D may vary according to the processes used.

Many variations and/or modifications can be made to embodiments of the disclosure. In some other embodiments, the depth D remains substantially the same during the formation of the package layer 170 and/or subsequent processes.

Figure 1C:
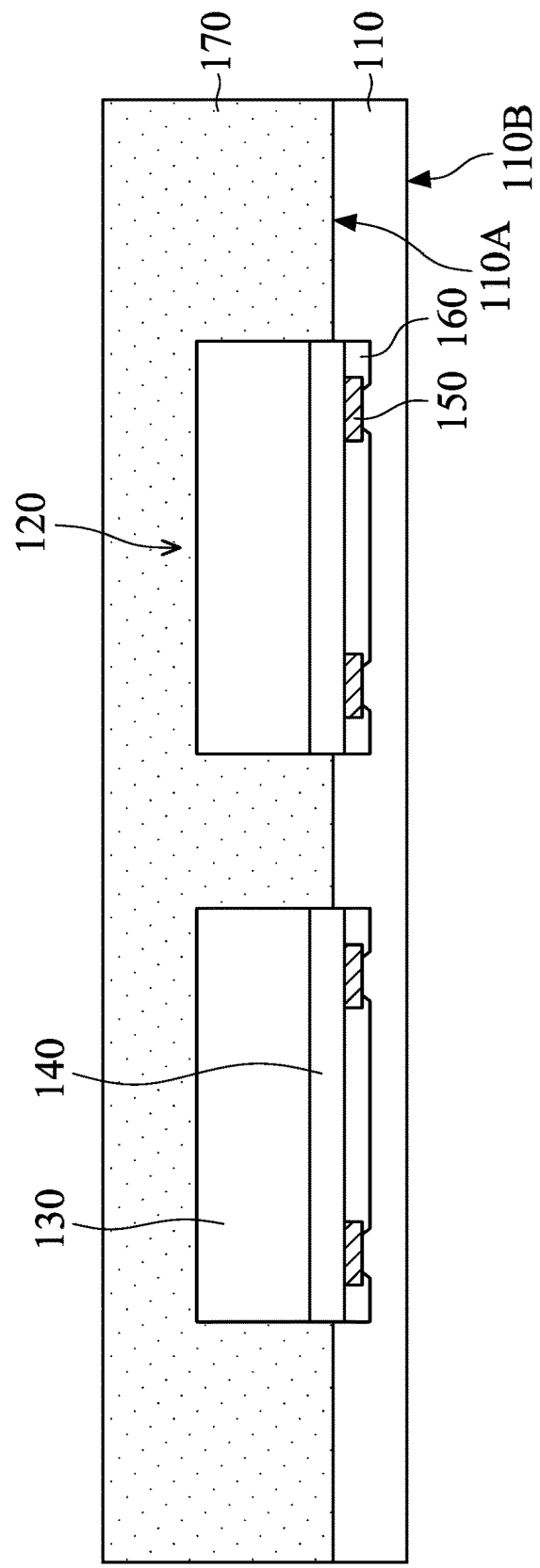

As shown in FIG. 1C, the carrier substrate 100 is removed from the adhesive layer 110, in accordance with some embodiments. As a result, the bottom surface 110B of the adhesive layer 110 is exposed. In some embodiments, the carrier substrate 100 is separated from the adhesive layer 110 by light irradiation or heating.

Figure 1D:
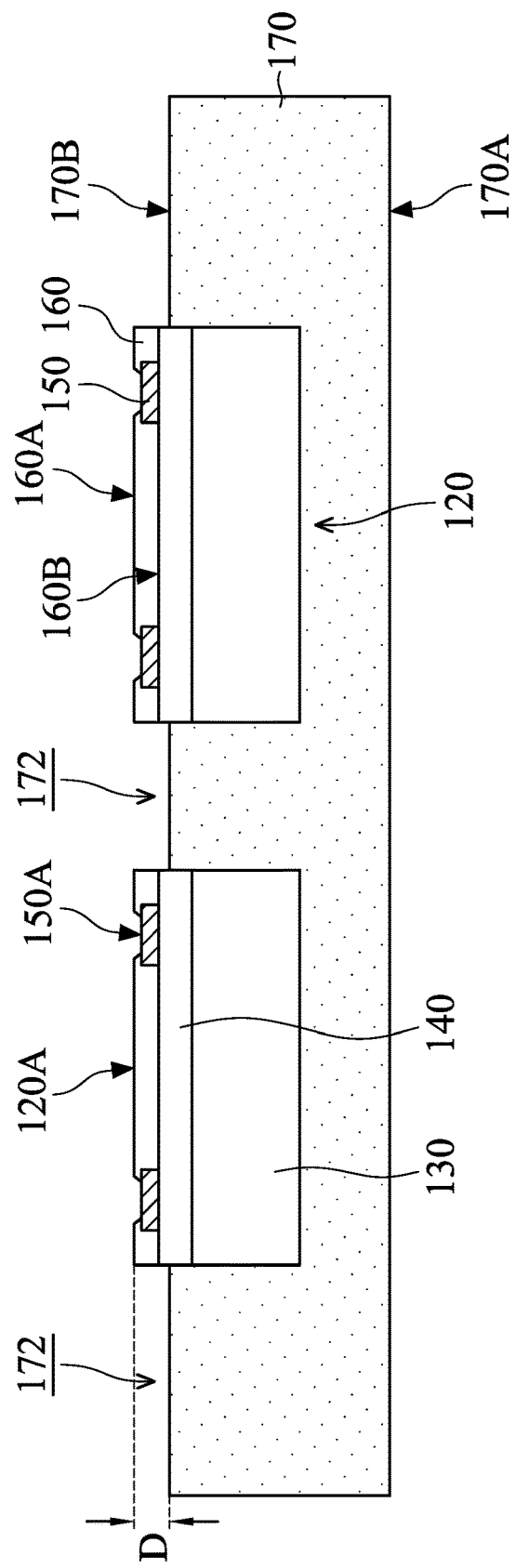

As shown in FIG. 1D, the adhesive layer 110 is peeled off and removed, in accordance with some embodiments. As a result, the integrated circuit dies 120 are partially exposed. For example, the surface 160A of the passivation layer 160 and the surface 150A of the conductive pads 150 are exposed. The sidewall 120C of the integrated circuit dies 120 becomes exposed after the removal of the adhesive layer 110. In some embodiments, the sidewall of the passivation layer 160 is partially or completely exposed. In some embodiments, the sidewall of the dielectric layer 140 is partially or completely exposed.

The package layer 170 has opposite surfaces 170A and 170B. The surface 170A covers the integrated circuit dies 120. The surface 170B becomes exposed after the removal of the adhesive layer 110. The integrated circuit dies 120 protrude from the exposed surface 170B, as shown in FIG. 1D. As a result, a gap 172 is formed between the exposed surface 170B and the active surface 120A. In some embodiments, the depth D of the gap 172 is in a range from about 1 µm to about 20 µm. However, embodiments of the disclosure are not limited thereto.

As mentioned above, the package layer 170 fills up the recesses of the adhesive layer 110 and/or covers the protrusions of the adhesive layer 110, in accordance with some embodiments. As a result, the package layer 170 may have recesses and/or protrusions along the sidewall 120C of the integrated circuit dies 120 due to the removal of the adhesive layer 110. The recesses and/or protrusions may gradually shrink along the sidewall 120C. In other words, the gap 172 may extend into the package layer 170 due to the recesses of the package layer 170 or may be separated from the integrated circuit dies 120 by the protrusions of the package layer 170.

Figure 1E:
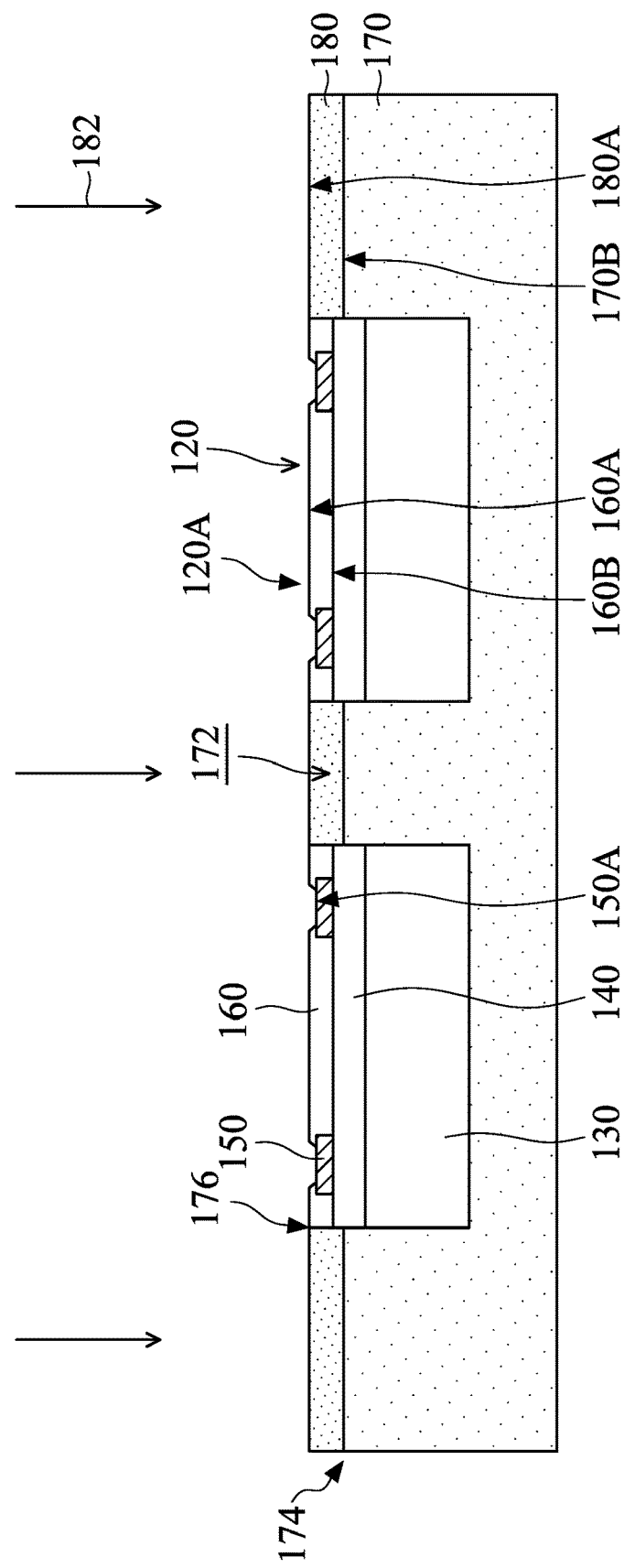

As shown in FIG. 1E, a planarization layer 180 is deposited over the exposed surface 170B of the package layer 170, in accordance with some embodiments. In some embodiments, the planarization layer 180 fills the gap 172. The gap 172 may be completely or partially filled with the planarization layer 180. In some embodiments, the planarization layer 180 is in direct contact with the package layer 170.

In some embodiments, the planarization layer 180 continuously surrounds the integrated circuit dies 120 and extends between the integrated circuit dies 120. In some embodiments, the planarization layer 180 does not cover or extend over the active surface 120A of the integrated circuit dies 120. In some embodiments, the planarization layer 180 does not cover the surface 160A of the passivation layer 160 and/or the surface 150A of the conductive pads 150. In some embodiments, the planarization layer 180 is in direct contact with the passivation layer 160 and/or the dielectric layer 140.

As shown in FIG. 1E, there is an interface 174 between the planarization layer 180 and the package layer 170, in accordance with some embodiments. The planarization layer 180 has a surface 180A that is opposite to the interface 174. In some embodiments, the surface 180A of the planarization layer 180 is substantially coplanar with the active surface 120A of the integrated circuit dies 120 or the surface 160A of the passivation layer 160. The surface 180A may be non-coplanar with the surface 160A but closer enough to the surface 160A. As a result, the surface 180A and the surface 160A together form a substantially flat surface. In some embodiments, the active surface 120A is closer to the interface 174 than the non-active surface 120B.

In some embodiments, there is an interface 176 between the planarization layer 180 and the passivation layer 160. Although FIG. 1E shows that the surface 180A of the planarization layer 180 is substantially perpendicular to the interface 176, embodiments of the disclosure are not limited thereto. In some other embodiments, the surface 180A of the planarization layer 180 is inclined to the interface 176. In some other embodiments, a portion of the package layer 170 is sandwiched between the planarization layer 180 and the passivation layer 160. There may be no interface between the planarization layer 180 and the passivation layer 160.

As mentioned above, the package layer 170 has recesses and/or protrusions along the sidewall 120C of the integrated circuit dies 120, in accordance with some embodiments. As a result, the planarization layer 180 on the package layer 170 may fill up the recesses and/or may cover and surround the protrusions.

In some embodiments, the planarization layer 180 has a thickness that is substantially the same as the depth D. In some embodiments, the planarization layer 180 is made of an insulating material. In some embodiments, the planarization layer 180 includes polybenzoxazole (PBO), polyimide (PI), another suitable material, or a combination thereof. In some embodiments, the material of the planarization layer 180 is different from that of the package layer 170.

Many variations and/or modifications can be made to embodiments of the disclosure. In some other embodiments, the material of the planarization layer 180 is substantially the same as that of the package layer 170. In some other embodiments, the planarization layer 180 includes an underfill material. The underfill material includes fillers dispersed therein. The fillers may include insulating fibers, insulating particles, other suitable elements, or a combination thereof. The fillers in the planarization layer 180 may be substantially the same as or different from those in the package layer 170. In some embodiments, the size of the fillers in the planarization layer 180 is less than that of the fillers in the package layer 170.

As shown in FIG. 1E, a dispensing process 182 is performed over the surface 170B of the package layer 170 so as to deposit the planarization layer 180, in accordance with some embodiments. In some embodiments, the dispensing process 182 is performed along the gap 172, as shown in FIG. 1E. In some embodiments, the material of the planarization layer 180 is not deposited over the active surface 120A of the integrated circuit dies 120 during the dispensing process 182. As a result, the conductive pads 150 remain exposed during the dispensing process 182 and are not covered by the planarization layer 180.

Many variations and/or modifications can be made to embodiments of the disclosure. In some other embodiments, the planarization layer 180 is deposited using a spin-on process, a spray coating process, a lamination process, a chemical vapor deposition (CVD) process, a physical vapor deposition (PVD) process, another applicable process, or a combination thereof.

In some embodiments, a curing process is subsequently performed to cure the planarization layer 180. In some embodiments, a planarization process is subsequently performed over the surface 180A of the planarization layer 180. The planarization process includes a grinding process, a chemical mechanical polishing (CM)) process, an etching process, another applicable process, or a combination thereof. In some other embodiments, the planarization process is not performed over the surface 180A of the planarization layer 180.

Figure 1F:
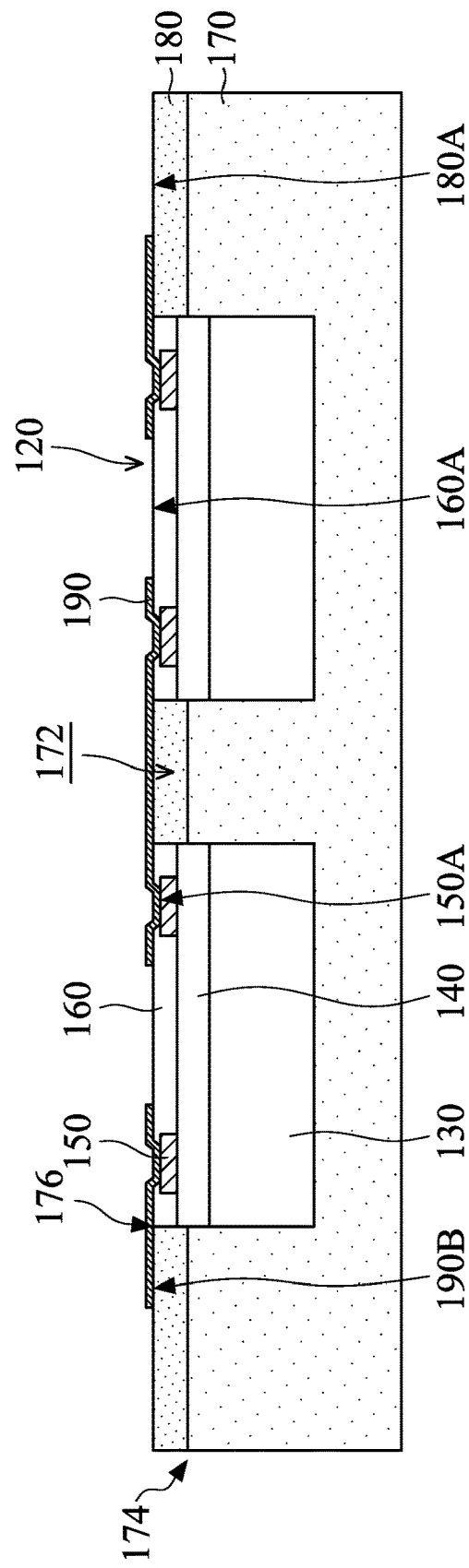

As shown in FIG. 1F, a patterned redistribution layer 190 is formed over the surface 180A of the planarization layer 180 and the surface 160A of the passivation layer 160, in accordance with some embodiments. The redistribution layer 190 extends to the surface 150A of the conductive pads 150 and is electrically connected to the conductive pads 150 of the integrated circuit dies 120. In some embodiments, the redistribution layer 190 is in direct contact with the surface 150A of the conductive pads 150.

In some embodiments, a portion of the planarization layer 180 is sandwiched between the redistribution layer 190 and the package layer 170. In some embodiments, the redistribution layer 190 extends across the interface 176 between the planarization layer 180 and the passivation layer 160. The redistribution layer 190 extends from the surface 180A of the planarization layer 180 to the surface 160A of the passivation layer 160. As a result, the redistribution layer 190 extends across the interface 176 along a direction that is substantially parallel to the surface 180A of the planarization layer 180.

In some embodiments, the redistribution layer 190 does not extend into the gap 172. The redistribution layer 190 is separated from the package layer 170 by the planarization layer 180 in the gap 172. In some embodiments, the redistribution layer 190 does not bend to the package layer 170. In some embodiments, the redistribution layer 190 includes flat and straight lines or traces as viewed from a cross-sectional view. The cross-sectional view is taken along a plane that is perpendicular to the main surface of the integrated circuit dies 120. The main surface of the integrated circuit dies 120 may be the active surface 120A of the integrated circuit dies 120.

In some embodiments, the line width and/or the line space of the redistribution layer 190 is in a range from about 1 μm to about 10 μm. However, embodiments of the disclosure are not limited thereto.

In some embodiments, the redistribution layer 190 is made of a metal material. The metal material includes copper (Cu), aluminum (Al), tungsten (W), gold (Au), another suitable material, or a combination thereof. In some embodiments, the metal material is deposited using an electroplating process, an electroless plating process, a sputtering process, another applicable process, or a combination thereof. An etching process may be used to pattern the metal material to form the redistribution layer 190.

Figure 1G:
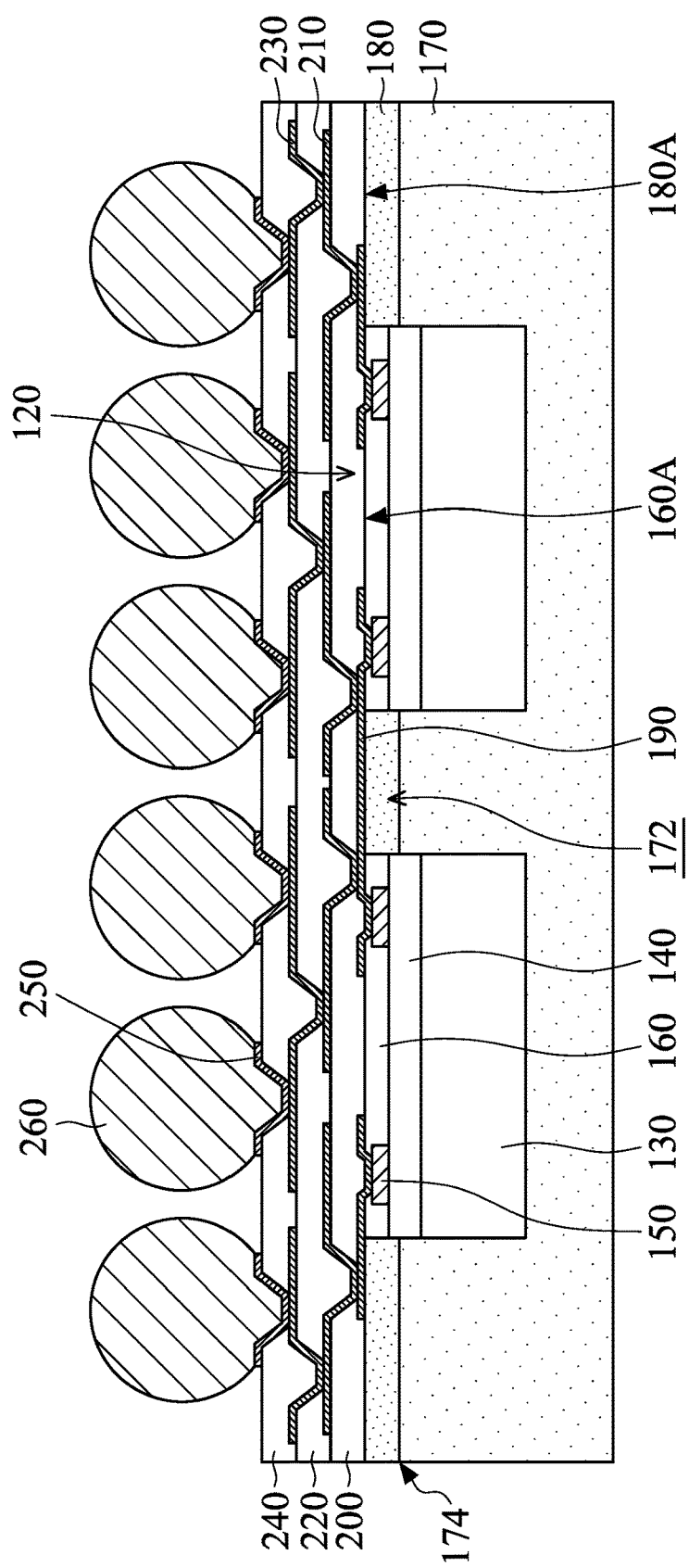

As shown in FIG. 1G, a passivation layer 200 with openings is formed over the planarization layer 180 and the passivation layer 160, in accordance with some embodiments. The passivation layer 200 covers the redistribution layer 190. The redistribution layer 190 is partially exposed from the openings of the passivation layer 200.

In some embodiments, the passivation layer 200 is in direct contact with the planarization layer 180. In some embodiments, the passivation layer 200 does not fill or extend into the gap 172. In some embodiments, the passivation layer 200 is separated from the package layer 170 by the planarization layer 180 in the gap 172.

In some embodiments, the passivation layer 200 is made of PBO, BCB, silicone, acrylates, siloxane, another suitable material, or a combination thereof. In some other embodiments, the passivation layer 200 is made of non-organic materials. The non-organic materials includes silicon oxide, un-doped silicate glass, silicon oxynitride, SR, silicon nitride, silicon carbide, HMDS, another suitable material, or a combination thereof.

Multiple deposition, coating, and/or etching processes may be used to form the passivation layer 200 with the openings. For example, a CVD process or a spin-on coating process may be used to deposit the passivation layer 200. Afterwards, an etching process may be used to form the openings of the passivation layer 200.

Subsequently, a patterned redistribution layer 210 is formed over the passivation layer 200, as shown in FIG. 1G. The redistribution layer 210 extends into the openings of the passivation layer 200 and is electrically connected to the redistribution layer 190.

Afterwards, a passivation layer 220 with openings, a patterned redistribution layer 230, and a passivation layer 240 with openings are sequentially formed over the redistribution layer 210, as shown in FIG. 1G. The passivation layer 220 partially covers the redistribution layer 210. The redistribution layer 230 extends into the openings of the passivation layer 220 and is electrically connected to the redistribution layer 210. The passivation layer 240 partially covers the redistribution layer 230.

In some embodiments, the materials and/or formation methods of the redistribution layers 210 and 230 are similar to those of the redistribution layer 190. In some embodiments, the materials and/or formation methods of the passivation layers 220 and 240 are similar to those of the passivation layer 200.

As shown in FIG. 1G, an under-bump metallization (UBM) element 250 is formed in the openings of the passivation layer 240, in accordance with some embodiments. In some embodiments, the UBM element 250 includes a diffusion barrier layer and a solderable layer. The diffusion barrier layer may include tantalum nitride, titanium nitride, tantalum, titanium, another suitable diffusion barrier material, or a combination thereof. The solderable layer may be a copper layer on the diffusion barrier layer. In addition to copper, the solderable layer may be a stacking-layer including copper, chromium, nickel, tin, or gold. However, embodiments of the disclosure are not limited thereto.

As shown in FIG. 1G, connectors 260 are formed over the passivation layer 240, in accordance with some embodiments. The connectors 260 are attached to the UBM element 250 and fill up the openings of the passivation layer 240.

In some embodiments, each of the connectors 260 includes conductive structures, such as conductive balls or other suitable connectors. In some embodiments, the connectors 260 include solder, another suitable conductive material, or a combination thereof.

In some embodiments, the connectors 260 are placed in the openings of the passivation layer 240. Afterwards, a reflow process is performed to bond the connectors 260 and the UBM element 250 together.

Afterwards, a singulation process is performed to form a single package unit (package structure). Each package unit includes one or more integrated circuit dies 120 embedded in the package layer 170 and the planarization layer 180. The package unit may be a fan-out chip package. In some embodiments, the singulation process includes a dicing process to cut the package layer 170 and the planarization layer 180 along scribe lines by a saw blade or laser beam. However, embodiments of the disclosure are not limited thereto.

Figure 2A:
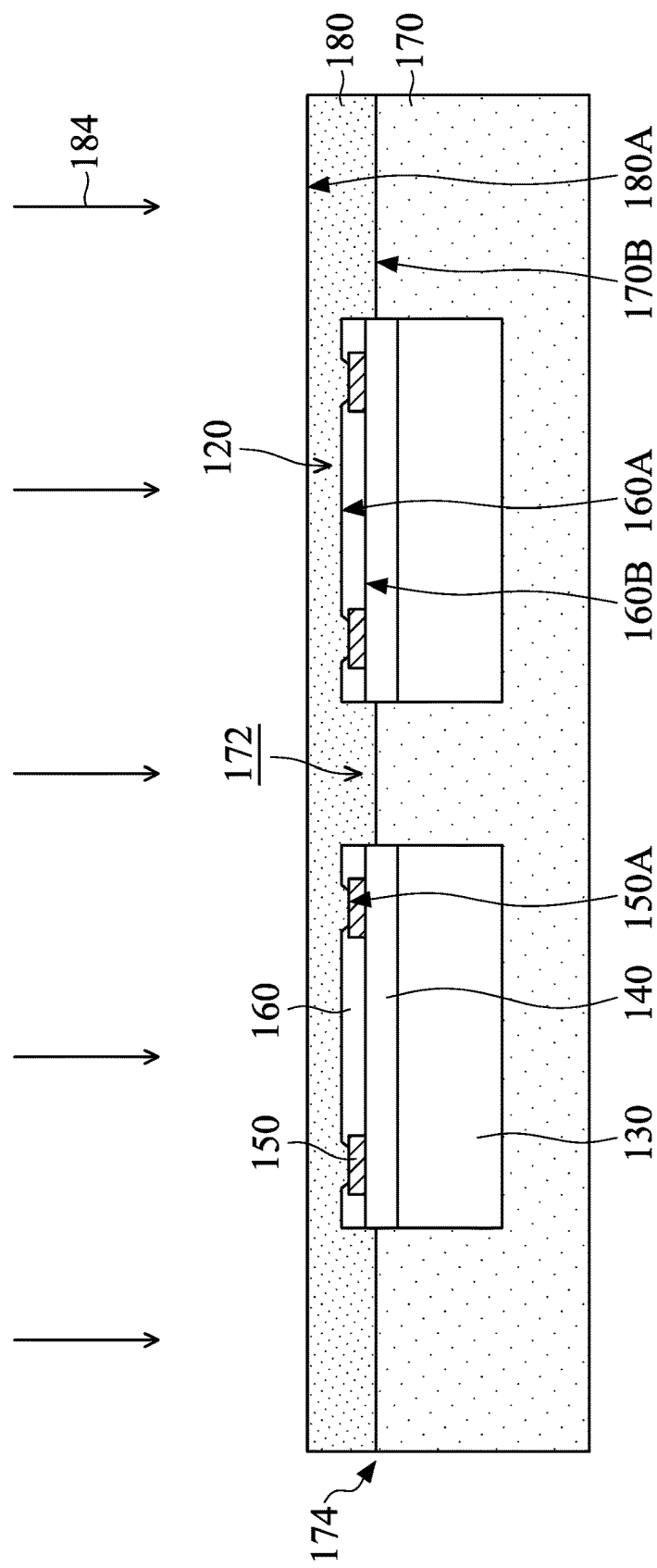
FIGS. 2A and 2B are cross-sectional views of various stages of a process for forming a package structure, in accordance with some embodiments.
Figure 2B:
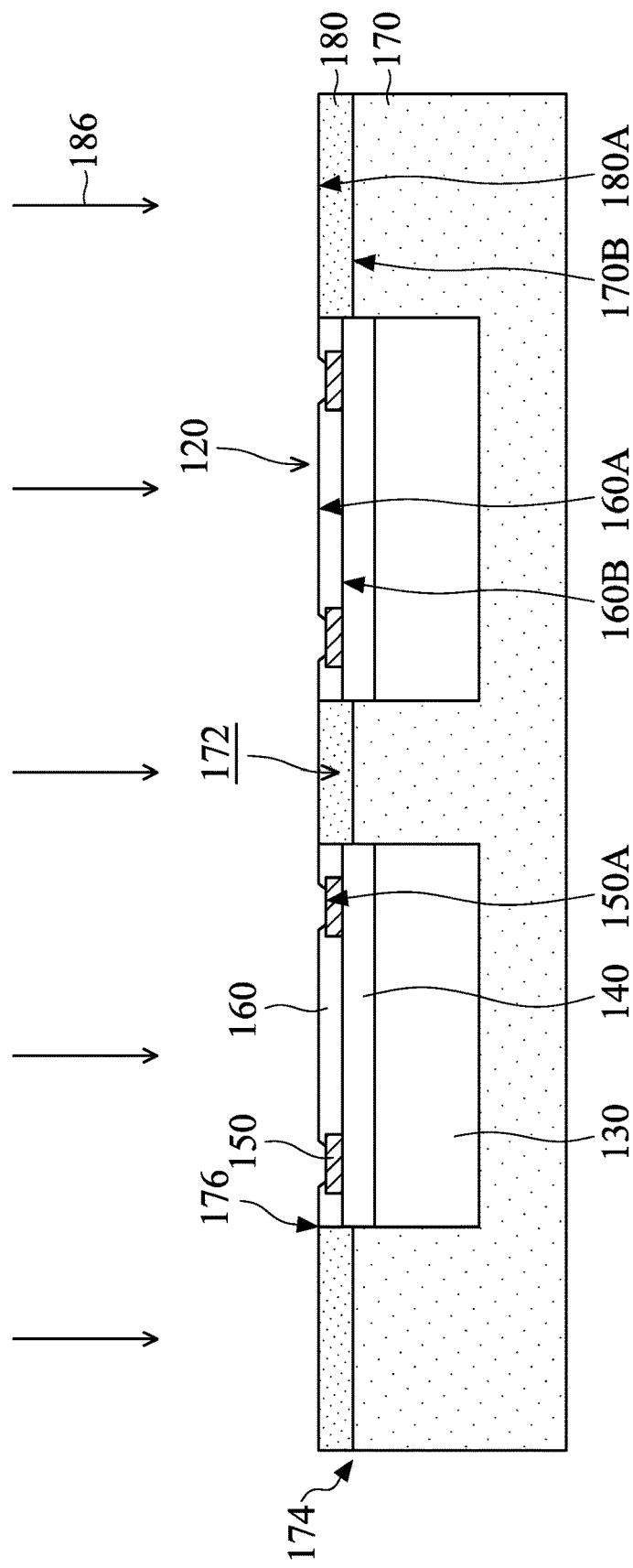

Many variations and/or modifications can be made to embodiments of the disclosure. FIGS. 2A and 2B are cross-sectional views of various stages of a process for forming a package structure, in accordance with some embodiments. In some embodiments, the materials and/or formation methods of the package structure shown in FIGS. 2A and 2B are similar to those of the package structure shown in FIGS. 1A-1G.

As shown in FIG. 2A, the structure shown in FIG. 1D is provided. The planarization layer 180 is then deposited over the surface 170B of the package layer 170 so as to fill up the gap 172. In some embodiments, the planarization layer 180 covers and extends over the active surface 120A of the integrated circuit dies 120. As a result, the planarization layer 180 covers the surface 160A of the passivation layer 160 and the surface 150A of the conductive pads 150.

In some embodiments, the planarization layer 180 is made of a photosensitive material. Therefore, the planarization layer 180 is photopatternable and can be patterned by using exposure and developing processes without an etching process. In some embodiments, the planarization layer 180 includes PBO, PI, another suitable material, or a combination thereof. In some embodiments, the material of the planarization layer 180 is different from that of the package layer 170.

As shown in FIG. 2A, a deposition process 184 is performed over the surface 170B of the package layer 170 so as to deposit the planarization layer 180, in accordance with some embodiments. In some embodiments, the planarization layer 180 is deposited on the active surface 120A of the integrated circuit dies 120 during the deposition process 184. As a result, the conductive pads 150 become covered by the planarization layer 180 during the deposition process 184.

In some embodiments, the deposition process 184 includes a spin-on process, a spray coating process, a lamination process, a CVD process, a PVD process, another applicable process, or a combination thereof.

As shown in FIG. 2B, a planarization process 186 is performed over the surface 180A of the planarization layer 180, in accordance with some embodiments. As a result, the planarization layer 180 is thinned. In some embodiments, the planarization process 186 is performed until the active surface 120A of the integrated circuit dies 120 is exposed. In some embodiments, the planarization layer 180 is partially removed until the surface 150A of the conductive pads 150 is exposed.

In some embodiments, the planarization process 186 includes a grinding process, a CMP process, an etching process, another applicable process, or a combination thereof. In some other embodiments, the planarization process 186 includes exposure and developing processes, another applicable process, or a combination thereof. In some embodiments, exposure and developing processes are used to pattern and thin the planarization layer 180. As a result, there is substantially no residue of the planarization layer 180 on the surface 150A of the conductive pads 150.

After the planarization process 186, the surface 180A of the planarization layer 180 is substantially coplanar with (or substantially aligned to) the active surface 120A of the integrated circuit dies 120 or the surface 160A of the passivation layer 160. As a result, the surface 180A and the surface 160A together form a substantially flat surface.

Subsequently, the steps described in FIGS. 1F and 1G are performed to form the structure shown in FIG. 1G. Afterwards, a singulation process is performed over the structure shown in FIG. 1G to form a single package unit.

Embodiments of the disclosure provide a package structure with a planarization layer. A die is placed on a temporary adhesive layer. A package layer surrounds the die on the temporary adhesive layer. In some cases, the die would slightly sink into the temporary adhesive layer. After the temporary adhesive layer is removed, a step gap would be formed between the die and the package layer.

In accordance with some embodiments, the step gap is mitigated or eliminated by filling the planarization layer. As a result, a substantially flat surface is provided to form a patterned redistribution layer. Due to the planarization layer, the redistribution layer does not bend or curve towards the package layer. Accordingly, the redistribution layer is prevented from being vulnerable to crack. Therefore, the reliability of the package structure is significantly enhanced.

Furthermore, since the redistribution layer can be formed on a planarized surface, it provides more flexibility in the arrangement of the redistribution layer. For example, the line width and/or the line space of the redistribution layer can be reduced even further. Accordingly, the number of input and output (I/O) connections is greatly increased, in accordance with some embodiments. Therefore, the design flexibility of the package structure is improved and the package structure is suitable for high-end applications with high I/O requirements.

Many variations and/or modifications can be made to embodiments of the disclosure. For example, although the described embodiments provide a package structure having a "fan-out" feature, embodiments of the disclosure are not limited thereto. Embodiments of the disclosure may be applied to any suitable package structure for any suitable technology generation.

In accordance with some embodiments, a package structure is provided. The package structure includes a molding compound having a surface. The package structure also includes an integrated circuit die in the molding compound. The integrated circuit die has a portion protruding from the surface. The package structure further includes a planarization layer covering the surface. The planarization layer surrounds the portion of the integrated circuit die. In addition, the package structure includes a redistribution layer electrically connected to the integrated circuit die. The redistribution layer covers the planarization layer and the integrated circuit die.

In accordance with some embodiments, a package structure is provided. The package structure includes a semiconductor substrate. The package structure also includes a dielectric layer over the semiconductor substrate. The package structure further includes a conductive pad over the dielectric layer. In addition, the package structure includes a passivation layer over the dielectric layer. The conductive pad is partially exposed from a surface of the passivation layer. The package structure also includes a package layer surrounding the semiconductor substrate. The package structure further includes a planarization layer covering the package layer. The planarization layer surrounds the passivation layer and the conductive pad. Furthermore, the package structure includes a redistribution layer electrically connected to the conductive pad. The redistribution layer covers the planarization layer and the surface of the passivation layer.

In accordance with some embodiments, a method for forming a package structure is provided. The method includes providing a carrier substrate. The method also includes forming an adhesive layer over the carrier substrate. The method further includes placing an integrated circuit die over the adhesive layer. The integrated circuit die sinks into the adhesive layer. In addition, the method includes forming a package layer covering the integrated circuit die and the adhesive layer. The method also includes removing the adhesive layer and the carrier substrate. A gap is formed between the integrated circuit die and the package layer. The method further includes forming a planarization layer to fill the gap. Furthermore, the method includes forming a redistribution layer covering the planarization layer and the integrated circuit die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a molding compound having a surface;
an integrated circuit die in the molding compound, wherein a first passivation layer of the integrated circuit die protrudes from the surface;
a planarization layer covering the surface, wherein the planarization layer surrounds the first passivation layer of the integrated circuit die, and the molding compound is separated from the first passivation layer by the planarization layer; and
a redistribution layer electrically connected to the integrated circuit die, wherein the redistribution layer covers the planarization layer and the integrated circuit die.

2. The package structure as claimed in claim 1, wherein the integrated circuit die has a first top surface and a first bottom surface that is embedded in the molding compound, and the planarization layer has a second top surface and a second bottom surface that faces the molding compound, and wherein the second top surface is substantially coplanar with the first top surface.

3. The package structure as claimed in claim 1, wherein the integrated circuit die comprises a conductive pad, and the conductive pad is surrounded by the planarization layer.

4. The package structure as claimed in claim 1, wherein the redistribution layer is separated from the molding compound by the planarization layer.

5. The package structure as claimed in claim 1, wherein there is an interface between the planarization layer and the integrated circuit die, and the redistribution layer extends across the interface.

6. The package structure as claimed in claim 1, wherein the planarization layer comprises polybenzoxazole, polyimide, an underfill material or a photosensitive material.

7. The package structure as claimed in claim 1, further comprising a second passivation layer covering the redistribution layer, wherein the second passivation layer is separated from the molding compound by the planarization layer.

8. A package structure, comprising:
a semiconductor substrate;
a dielectric layer over the semiconductor substrate;
a conductive pad over the dielectric layer;
a passivation layer over the dielectric layer, wherein the conductive pad is partially exposed from a surface of the passivation layer;
a package layer surrounding the semiconductor substrate;
a planarization layer covering the package layer, wherein the planarization layer surrounds the passivation layer and the conductive pad, and a sidewall of the planarization layer adjoins a sidewall of the passivation layer and a portion of a sidewall of the dielectric layer; and a redistribution layer electrically connected to the conductive pad, wherein the redistribution layer covers the planarization layer and the surface of the passivation layer.

9. The package structure as claimed in claim 8, wherein there is an interface between the planarization layer and the package layer, and the planarization layer has a second surface opposite to the interface, and wherein the second surface is substantially coplanar with the surface of the passivation layer.

10. The package structure as claimed in claim 8, wherein there is an interface between the planarization layer and the package layer, and the planarization layer has a second surface opposite to the interface, and wherein the redistribution layer extends from the second surface to the surface of the passivation layer along a direction that is substantially parallel to the second surface.

11. The package structure as claimed in claim 8, wherein the package layer is separated from the passivation layer by the planarization layer.

12. The package structure as claimed in claim 8, wherein the dielectric layer is surrounded by the planarization layer, the package layer, or a combination thereof.

13. The package structure as claimed in claim 8, wherein a portion of the planarization layer is sandwiched between the redistribution layer and the package layer.

14. A package structure, comprising:
a plurality of integrated circuit dies, wherein each of the plurality of integrated circuit dies includes a semiconductor substrate, a conductive pad, and a passivation layer over the substrate and the conductive pad and wherein the conductive pad is partially exposed from a surface of the passivation layer;
a molding compound surrounding the semiconductor substrate of each of the plurality of integrated circuit dies, wherein the passivation layer of each of the plurality of integrated circuit dies is protruded from a surface of the molding compound;
a planarization layer covering the surface of the molding compound and surrounding the passivation layer of each of the plurality of integrated circuit dies, wherein the planarization layer has a surface opposite to the surface of the molding compound, and wherein the surface of the planarization layer is substantially coplanar with the surface of the passivation layer of each of the plurality of integrated circuit dies; and
a redistribution layer covering the planarization layer and the surface of the passivation layer of each of the plurality of integrated circuit dies and electrically connected to the conductive pad of each of the plurality of integrated circuit dies.

15. The package structure as claimed in claim 14, wherein each of the plurality of integrated circuit dies further comprises a dielectric layer between the conductive pad and the semiconductor substrate and surrounded by the planarization layer.

16. The package structure as claimed in claim 15, wherein the dielectric layer is surrounded by the molding compound.

17. The package structure as claimed in claim 14, wherein the redistribution layer is separated from the molding compound by the planarization layer.

18. The package structure as claimed in claim 14, wherein there is an interface between the planarization layer and each of the plurality of integrated circuit dies, and the redistribution layer extends across the interface.

19. The package structure as claimed in claim 14, wherein the planarization layer comprises polybenzoxazole, polyimide, an underfill material or a photosensitive material.

20. The package structure as claimed in claim 14, wherein a bottom surface of the conductive pads is higher than a bottom surface of the planarization layer.

* * * * *